(12) United States Patent
Watzinger et al.

(10) Patent No.: US 11,434,571 B2
(45) Date of Patent: *Sep. 6, 2022

(54) HARD MATERIAL LAYER ON METAL SUBSTRATE

(71) Applicant: IWIS Motorsysteme GmbH & Co. KG, Munich (DE)

(72) Inventors: Bernd Watzinger, Munich (DE); Matija Burger, Munich (DE)

(73) Assignee: IWIS Motorsysteme GmbH & Co. KG, Munich (DE)

( * ) Notice: Subject to any disclaimer, the term of this patent is extended or adjusted under 35 U.S.C. 154(b) by 0 days.

This patent is subject to a terminal disclaimer.

(21) Appl. No.: 16/970,165

(22) PCT Filed: Feb. 14, 2019

(86) PCT No.: PCT/EP2019/053749
§ 371 (c)(1),
(2) Date: Aug. 14, 2020

(87) PCT Pub. No.: WO2019/158670
PCT Pub. Date: Aug. 22, 2019

(65) Prior Publication Data
US 2021/0102297 A1 Apr. 8, 2021

(30) Foreign Application Priority Data
Feb. 14, 2018 (DE) ..................... 10 2018 103 323.0

(51) Int. Cl.
*C23C 16/34* (2006.01)
*C23C 28/04* (2006.01)
(Continued)

(52) U.S. Cl.
CPC ............ *C23C 28/048* (2013.01); *C23C 16/34* (2013.01); *C23C 28/042* (2013.01);
(Continued)

(58) Field of Classification Search
CPC ........ F16G 13/06; C23C 16/34; C23C 28/048
(Continued)

(56) References Cited

U.S. PATENT DOCUMENTS 9,457,407 B2 * 10/2016 Imamura ............... C23C 14/325
2003/0192299 A1 10/2003 Kaga et al.
(Continued)

FOREIGN PATENT DOCUMENTS

DE 37 25 321 4/1988
DE 103 15 166 A1 10/2003
(Continued)

OTHER PUBLICATIONS

International Search Report issued by the European Patent Office in International Application PCT/EP2019/063749 dated Apr. 9, 2019.

*Primary Examiner* — Archene A Turner
(74) *Attorney, Agent, or Firm* — Henry M. Feiereisen LLC (57) ABSTRACT

A chain component of a chain for transmitting a force includes a steel-based substrate and a hard material layer on an external side of the steel-based substrate. The hard material layer contains metal nitrides and the metal carbide content in the hard material layer decreases toward the external side of the hard material layer.

16 Claims, 4 Drawing Sheets

(51) Int. Cl.
  *C23C 30/00*   (2006.01)
  *F16G 13/18*   (2006.01)
  *C23C 24/00*   (2006.01)

(52) U.S. Cl.
  CPC .......... *C23C 28/044* (2013.01); *C23C 30/005* (2013.01); *F16G 13/18* (2013.01); *C23C 24/00* (2013.01)

(58) Field of Classification Search
  USPC ........................................................ 428/698
  See application file for complete search history.

(56) References Cited

U.S. PATENT DOCUMENTS

| | | | |
|---|---|---|---|
| 2003/0195074 A1 | 10/2003 | Kaga et al. | |
| 2014/0050932 A1 | 2/2014 | Gierl et al. | |
| 2015/0211603 A1 | 7/2015 | Koschig et al. | |
| 2016/0153525 A1* | 6/2016 | Eda | C21D 1/18 474/228 |
| 2017/0058997 A1* | 3/2017 | Asada | C23C 10/08 |

FOREIGN PATENT DOCUMENTS

| | | |
|---|---|---|
| DE | 103 16 484 A1 | 10/2003 |
| DE | 102005047449 | 9/2006 |
| DE | 102006052869 | 5/2008 |
| DE | 102011006294 | 10/2012 |
| DE | 102013222244 | 4/2015 |
| DE | 102016215709 | 3/2017 |
| EP | 2 868 947 | 5/2015 |
| WO | WO 2014/019699 | 2/2014 |
| WO | WO 2014/044420 | 3/2014 |

* cited by examiner

HARD MATERIAL LAYER ON METAL SUBSTRATE

CROSS-REFERENCES TO RELATED APPLICATIONS

This application is the U.S. National Stage of International Application No. PCT/EP2019/053749, filed Feb. 14, 2019, which designated the United States and has been published as International Publication No, WO 2019/158670 A1 and which claims the priority of German Patent Application, Serial No. 10 2018 103 323.0, filed Feb. 14, 2018, pursuant to 35 U.S.C. 119(a)-(d).

BACKGROUND OF THE INVENTION

The invention relates to a chain component of a chain for transmitting a force, coated with a hard material layer, comprising a steel-based substrate and a hard material layer on an external side of the steel-based substrate, wherein the hard material layer contains metal nitrides and the metal carbide content in the hard material layer decreases toward the external side of the component.

PRIOR ART

Articulated chains comprising chain links connected to each other through a chain joint are in use in a variety of forms. In operation as drive chains or conveyor chains, the chain link area in particular is under such a heavy load that there is a need for a wear-resistant bearing surface. In relation to high piece quantities in particular, it also makes sense to replace costly solutions with cost-effective coating methods and processes.

DE 10 2005 047 449 A1 presents a link chain with improved wear resistance, whose chain pins and chain sleeves are provided with hard material coatings. These coatings are applied by way of PVD (physical vapor deposition) methods. The hard material layer has a thickness of 1 to 10 µm and can also be surrounded by a sliding layer, e.g. PTFE.

The text in DE 10 2006 052 869 A1 describes a link chain where the link area of the pin and the sleeve is provided with a PVD hard material layer. The pin and sleeve comprise a high-carbon steel with a carbon content of between 0.4 wt. % and 1.2 wt. %.

DE 10 2011 006 294 A1 presents a method for producing a hardened, coated metal component. The metal component is heat-treated to enrich the edge layer with carbon and/or nitrogen, and then quenched to a temperature below martensite formation. The metal component is then tempered at a higher temperature than the temperature at which the subsequent coating process occurs. The coating itself is performed through CVD (chemical vapor deposition) or PVD methods.

In DE 10 2013 222 244 A1, a link plate for a chain is described, which is provided with a friction-reducing tribological coating. The coating is applied through PVD or PACVD methods.

DE 10 2016 215 709 A1 shows chain components such as sleeves, tabs, pins, and rollers made from steel which are provided with a wear-reducing CrN layer. The CrN layer is produced with a CVD method. The nitrogen is obtained from the nitrided steel, which may have been nitrided prior to treatment.

A link for a roller or sleeve chain is presented in WO 2014019699 A1. A nitride or carbide hard material layer is applied to the link by way of PVD or CVD methods.

The solutions mentioned for the production of a hardened, coated metal component have disadvantages. The PVD method requires an operating pressure of $10^{-4}$ to 10 Pa and is performed at operating temperatures of several hundred degrees Celsius depending on the type of coating. PVD methods thus place high demands on the coating chamber. Furthermore, they are not suitable for bulk materials. The substrate and material to be deposited (target) are spatially separated in the coating chamber. PVD methods are what are referred to as line-of-sight processes in that only the areas visible to the target are coated. Inner areas or holes are coated more thinly. By way of contrast, in powder-coating methods, there is the problem of the diffusion of carbon in the hard material layer leading to the formation of carbides. However, in terms of wear, since nitrides—and in particular here chromium nitride—promise significantly better component durability in operation, preventing the formation of nitrides in the areas close to the surface in particular is necessary. In no way do the solutions presented in the prior art achieve this.

It is therefore the object of this invention to provide a hardened, nitride-coated metal component whose hard material layer demonstrates high quality and durability, which is easy to use, allows the coating of large piece quantities per unit of time and is cost-effective to operate.

SUMMARY OF THE INVENTION

The task according to the invention is solved by a device as described hereinafter.

The chain component of a chain for transmitting a force according to the invention is coated with a hard material layer. The chain component has a steel-based substrate and a hard material layer on an external side of the substrate. The hard material layer has a boundary to the substrate and an external surface on the opposite side to the boundary. It is developed so that it has metal nitrides.

By way of CVD coating, a hard layer is deposited on the substrate made from high-carbon steel, which has a high degree of abrasion and wear resistance, a high degree of hardness and temperature resistance, a low level of friction, good chemical properties, and low adhesion. In addition to improving the wear resistance, the hard material layer also Increases the corrosion resistance. In this regard, carbon steels can be suitable as a substrate, because these steels have sufficient strength and temper resistance. The hard material layer can consist both of metallic and nonmetallic hard materials. All carbides, nitrides, carbon-nitrides, borides, and silicides of the transition metals, such as chromium, tungsten, zirconium, and titanium, are considered to be metallic hard materials. Diamond and DLC (diamond-like carbon), corundum, boron carbide, cubic boron nitride, silicon carbide, or aluminum nitride, for example, are suitable as nonmetallic hard materials. For the direct coating of the surfaces of substrates made from high-carbon steel, in particular metallic nitride formers, especially chromium nitride (CrN), have proven suitable. In comparison to other metallic and nonmetallic hard materials, chromium nitride is available and Inexpensive. Also, chromium nitride can be produced easily in a CVD coating system and, when bonded well to the substrate, creates a thin, hard material layer with a layer thickness of at least 1 to 5 µm with high wear resistance. The CVD method offers advantages over the PVD method known from the prior art for the creation of a hard material layer. Compared to the PVD method, the CVD method is suitable for bulk materials and offers economic advantages in terms of system engineering, operation, and process technology: for example, the substrate to be coated is mixed in a rotary drum with the nitrogen-based powder. The coating process is performed over several hours at a particular process temperature-approx. 700 to 1200° C. All accessible areas of the substrate are coated evenly, even narrow holes. At the end of the coating process, the coated substrate is cooled down. In the PVD method, the substrate and material to be deposited are disadvantageously spatially separated. The coating is performed by vaporizing the material to be deposited at operating pressures of 104 to 10 Pa.

The hard material layer is designed so that it mostly comprises CrN. On the surface of the component, the hard material layer has an outer side (external side) and an inner side in contact with the substrate. Through the use of carbon steels as a substrate, the carbon diffuses from the steel into the hard material layer at the high process temperatures, where it forms bonds of metal and carbon, referred to as metal carbides. The metals in the hard material layer are mostly chromium (Cr), which originates from the nitrogen-based powder, and iron (Fe), from the substrate or the nitrogen-based powder. The content of the metal carbides has been determined using the method of glow-discharge optical emission spectroscopy (GDOES). The hard material layer is advantageously developed so that the metal carbide content is less on the external side of the hard material layer than on the internal side. Consequently, the wear resistance of the chain component according to the invention, and thus the durability, is considerably increased. Furthermore, the hard material layer has a considerably greater metal nitride content on Its external side, which leads to an Improvement in wear resistance compared to a hard material layer made from metal carbides.

Further developments of the invention for the chain component with a hard material layer are shown in the dependent claims 2 to 15.

In a further development of the invention, the mass concentration of the nitrogen on the outside surface of the hard material layer is greater than the mass concentration of the carbon. In a preferred further development, the ratio of mass concentrations of nitrogen to carbon is greater than 3:1; especially preferred is greater than 5:1.

In an additional configuration of the Invention, the metal carbide content in the hard material layer Increases in an area near to the substrate toward the external side of the hard material layer. Carbon accumulates on the surface of the substrate through the diffusion of the carbon on the surface of the substrate comprising carbon steel. The metal carbide content of the hard material layer therefore increases near the surface of the substrate.

In a further embodiment of the invention, the metal carbide content reaches the maximum in the hard material layer. Carbon accumulates on the surface of the substrate through the diffusion of the carbon on the surface of the substrate comprising carbon steel. The metal carbide content of the hard material layer therefore has a maximum value near the surface of the substrate.

In an additional development of the invention, the span of the maximum amount of the metal carbide content in the hard material layer toward the external side of the hard material layer Is smaller than the span of the maximum amount of the metal carbide content in the hard material layer toward the boundary between the hard material layer and the substrate. Carbon accumulates on the surface of the substrate through the diffusion of the carbon on the surface of the substrate comprising carbon steel. The maximum value of the metal carbide content in the hard material layer is therefore near the substrate.

In an additional arrangement of the Invention, the amount of the increase of the metal carbide content in the hard material layer in an area near to the substrate is greater than the amount of the increase in an area of the decreasing metal carbide content. The metal carbide content increases steeply in an area near the substrate. Consequently, a majority of the carbon available in the hard material layer is bonded at a great depth in the hard material layer.

In an additional aspect of the invention, the mass concentration of nitrogen (N) in the hard material layer increases toward the external side of the hard material layer. The external side of the hard material layer therefore has a higher proportion of metal nitride than deeper areas. Consequently, the wear resistance of the chain component according to the invention is considerably increased.

In an additional configuration of the Invention, the increase of the metal nitride content in the hard material layer in an area near to the substrate is greater than the increase of the metal nitride content in an area near to the external side of the hard material layer. The metal nitride content of the hard material layer therefore has a maximum value near the surface of the substrate.

In an additional development of the invention, the average metal nitride content in the hard material layer is greater than the average metal carbide content in the hard material layer. To develop a hard material layer which is as homogeneous as possible, the metal nitride content can advantageously be increased through suitable process parameters, e.g. through nitriding the substrate and/or through the use of a nitrogen-based powder.

In a further embodiment of the invention, the average metal nitride content in the hard material layer is greater than the average metal carbide content in the hard material layer by a factor of 2, preferably by a factor of 3, and preferred in particular by a factor of 4. This embodiment ensures that the hard material layer is composed of metal nitride to a large extent.

In an additional arrangement of the invention, the average metal nitride content in the area of the hard material layer near the surface is greater than the average metal carbide content in the hard material layer at every depth. Carbon from the substrate made out of carbon steel accumulates at greater depths of the hard material layer near the substrate. This carbon enrichment leads to the formation of metal carbides. The area near the surface comprises a depth of up to 50% of the layer thickness, preferably 65% of the layer thickness, and preferred in particular up to 80% of the layer thickness.

In an additional development of the Invention, the average mass concentration of chromium (Cr) in the hard material layer is greater than the average mass concentration of iron (Fe) In the hard material layer. Cr is primarily integrated into the hard material layer through the coating process—e.g. using a Cr—Fe-based powder-during the CVD process.

In an additional configuration of the invention, the average Cr mass concentration in the hard material layer is greater than the average Fe mass concentration in the hard material layer by a factor of 2, preferably by a factor of 4, and preferred in particular by a factor of 6. In order to improve the adhesive properties of the hard material layer on the substrate, low amounts of Fe in the hard material layer will suffice.

In an additional arrangement of the invention, the average Cr mass concentration in the area of the hard material layer near the surface is greater than the average Fe mass concentration in the hard material layer at every depth. Fe from the substrate made out of steel accumulates at greater depths of the hard material layer near the substrate. The area near the surface comprises a depth of up to 50% of the layer thickness, preferably 65% of the layer thickness, and preferred in particular up to 80% of the layer thickness.

Embodiments of the chain components with a hard material layer according to the invention and of the method according to the invention are presented schematically in drawings in simplified form and are explained in more detail in the description below.

BRIEF DESCRIPTION OF THE DRAWING

The following is presented:
FIG. 1 Structure of a chain for use in chain drives,
FIG. 2 Cross section of a hard material layer on a pin,
FIG. 3 Depth profile analysis of sample 1 for the elements Fe, Cr, N, and C,
FIG. 4 Depth profile analysis of sample 2 for the elements Fe, Cr, N, and C.

DETAILED DESCRIPTION OF PREFERRED EMBODIMENTS

Figure 1:
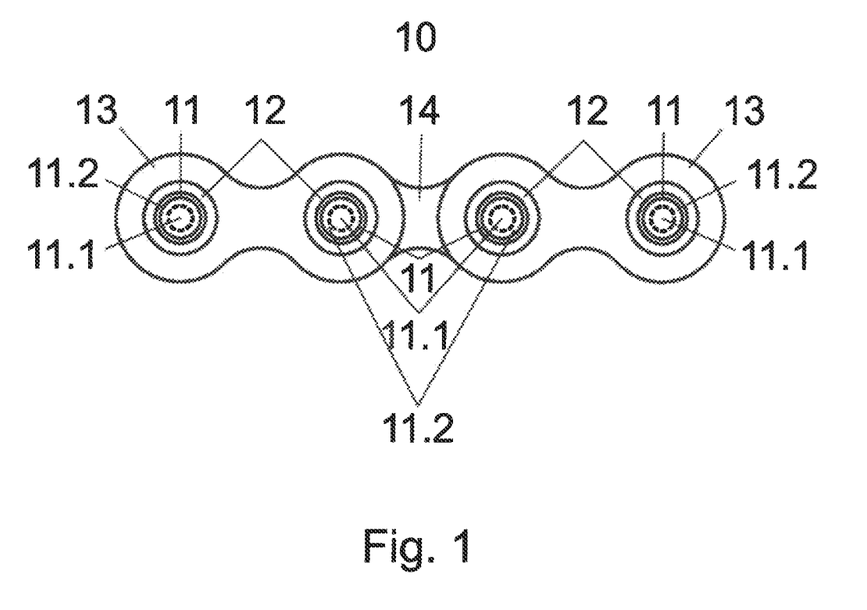

FIG. 1 shows two chain joints of a chain 10 which can be used in chain drives, for example. The chain 10 is designed as a sleeve chain with internal chain joints and external chain joints, each connected using one chain link. Each internal chain joint comprises two parallel-running internal tabs 13 and two sleeves 12 connecting the internal tabs 13 together, whereby the sleeves 12 are perpendicular to the internal tabs 13.

The external chain joints 14 comprise two parallel-running external tabs 14, which are connected together with two pins 11, whereby the pins 11 are rotatably mounted in the sleeves 12 of the internal chain joints 13. The external chain joint 14 is rotatably fixed to an adjacent internal chain joint 13 by the pin 11 and through the external tabs 14 connects the internal chain joint 13 to a second internal chain joint 13, whereby the external tabs 14 run parallel to the internal tabs 13. The pins 11 of the external chain joint 14 are rotatably mounted in the sleeves 12 of the internal chain joint 13, with each connection forming one chain link of the chain 10. The pins 11 of the chain 10 are made entirely of a carbon steel, whereby the link surface of the pin 11 is provided with a CrN hard material layer applied in a CVD method. Alternatively or additionally, the sleeve 12 can also be produced from a carbon-based material and provided with a CVD hard material layer on its link surface/bearing surface.

Figure 2:
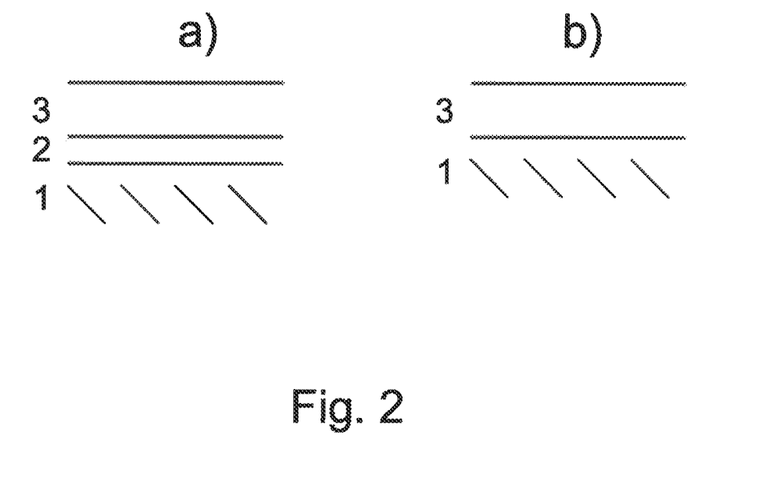

FIG. 2a shows a schematic cross section of a hard material layer 6 on a steel-based pin 11. The hard material layer 6 is designed so that it mostly comprises metal nitrides. Through the use of carbon steels as a substrate 11, the carbon diffuses from the steel into the hard material layer 6 at the high process temperatures, where it forms metal carbides. However, nitrides, in particular chromium nitride, have considerably better wear resistance than carbides. The hard material layer 6 is developed so that the metal carbide content is less on the external side of the hard material layer 6 than on the internal side. The metals in the hard material layer 6 are mostly chromium (Cr) and iron (Fe). Cr and N are preferably integrated into the hard material layer 6 through the coating process; the hard material layer 6 therefore primarily comprises chromium nitride.

FIG. 2b schematically shows a hard material layer 6 having an Intermediate layer 7. To improve the wear resistance of the pin 11, the outside area of the hard material layer 6 is developed so that it mainly comprises metal nitrides. The metals Cr and Fe originate from the nitrogen-based powder and are integrated into the hard material layer 6 during the coating process. The intermediate layer 7 primarily comprises metal carbides, CrC and FeC.

Two concentration profiles of two different chain components according to the invention are presented below, which have each been coated with a hard material layer by way of CVD methods. The samples are pins 11 made from a nitrided steel 40CrMoV13-9. The layers primarily comprise chromium nitrides and carbides; the layer thicknesses are around 10 µm. The concentration profiles of the two samples have been determined using the GDOES method. In this process, the metallic samples are used as cathodes in a direct current plasma. Starting from the surface, the sample is removed gradually in layers through cathode sputtering with argon Ions. The removed atoms enter the plasma through the diffusion. Excited through collision processes, they emit photons with characteristic wavelengths, which are recorded using a downstream spectrometer and subsequently quantified.

Figure 3:
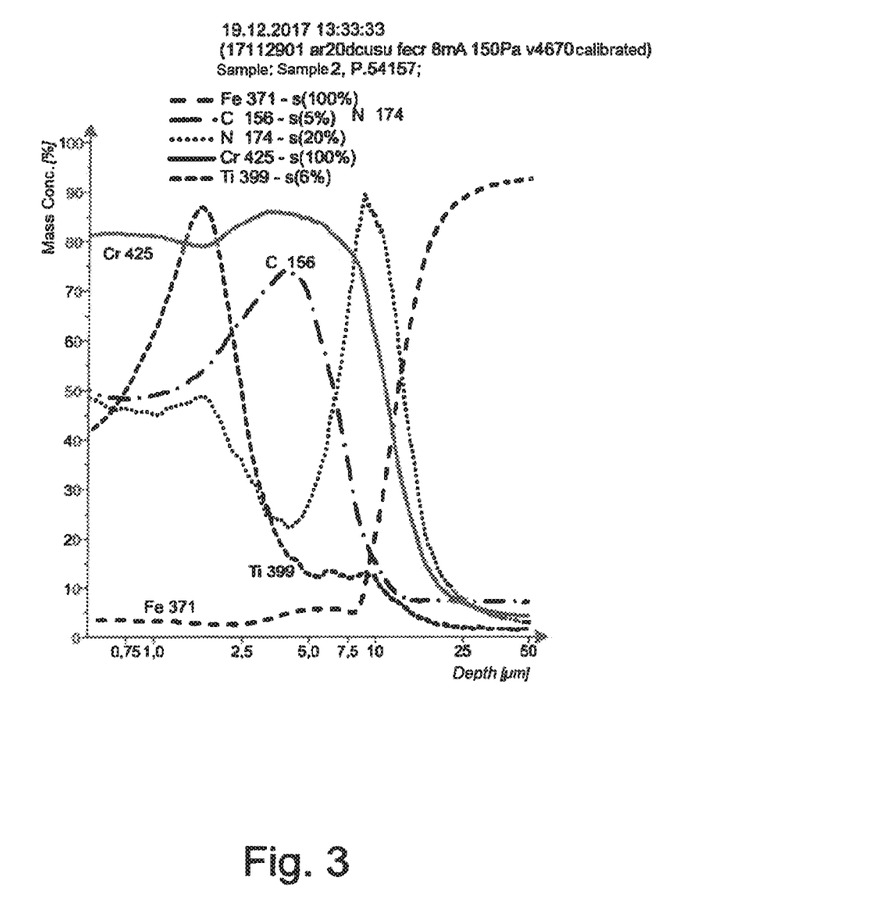

FIG. 3 shows the concentration profile of sample 1. During the separation process, there was first heating from 0° C. to 960° C. for approx. 1 hour. The holding time lasted 6 hours, and then there was a slow cool-down (approx. 10 hours) to 200° C. During the process, the reactor was flushed with nitrogen. The horizontal axis specifies the depth for improved viewing in a logarithmic scale. The vertical axis shows the mass concentration, also for reasons of clarity in a relative scale. 100% on the vertical axis equates to a mass concentration of the elements Fe and Cr of 100%, of N 20%, and of C 5%. While the nitrogen is primarily present in the form of metal nitrides, the carbon is primarily present in the form of metal carbides.

The Fe mass concentration is constantly near 0% within the area from 0 to 7.5 µm. From 8 µm, the Fe mass concentration increases to 5%. Within the area deeper than 10 µm, the Fe mass concentration increases sharply to 90%, up to 27 µm. From a depth greater than 27 µm, the Fe mass concentration increases constantly with a low gradient to 92%, at 50 µm. Accordingly, there are barely any Fe-based carbides or nitrides in the hard material layer.

The Cr mass concentration constantly increases within the range of 0 to 7.5 µm, from 86% at 0 µm to 88% at 7.5 µm. From a depth of 7.5 µm, the Cr mass concentration drops sharply down to 25 µm to a value of 10%. The Cr mass concentration and the Fe mass concentration are inversely proportional and confirm the layer thickness of the hard material layer 6 of 10 µm. From a depth of 25 µm, the Cr mass concentration drops to a value of 5% at a depth of 50 µm. The considerably higher values of the Cr mass concentration show that primarily Cr-based carbides and nitrides are present in the hard material layer.

At 0 µm, the N mass concentration has a value of 10.8% and drops to a value of 6% at 7.5 µm. The reduction in mass concentration is not constant—at a depth of 2.5 µm, an increase in N mass concentration to 9.4% can be detected. From a depth of 7.5 µm, the N mass concentration increases sharply to a maximum value of 15.6% at 10 µm. From a depth of 130 µm, the N mass concentration drops sharply to a value of 2% at 25 µm. This shows that, starting from the substrate, the nitride content initially increases steeply in a first area, and then in a subsequent second area, the nitride content falls again to a level of approx. 30% of the first nitride peak. In a third area, the nitride content then increases continuously up to the surface of the hard material layer. Accordingly, the thickness of the layer is approx. 13 μm.

According to the distribution of the C mass concentration, the carbide content near the surface of the hard material layer at 0 μm has a very low value and increases to double the value at 2.5 μm with a straight gradient. From a depth of 2.5 μm, the C content then increases sharply to a maximum value of approx. 4 times the value at the surface of the hard material layer at 7.5 μm. In a third area from a depth of 7.5 μm, the carbide content then falls back down sharply again, reaching a value at 25 μm below the value at the hard material layer surface.

In an area in the hard material layer near the surface of the hard material layer, the nitride content drops continuously down to a depth of 7.5 μm, while in the same area the carbide content increases continuously. The hard material layer 6 therefore mainly has CrN at its surface, the CrC content is at a depth of 7.5 μm, while the CrN content is at a minimum at the same position.

An analysis of the distributions of the mass concentrations of carbon and nitrogen shows that the mass concentration of the nitrogen is greater at the surface of the hard material layer than the mass concentration of the carbon. The ratio of the mass concentration of the metal nitrides to the mass concentration of the metal carbides is approximately 14:1, and therefore greater than 10:1.

Figure 4:
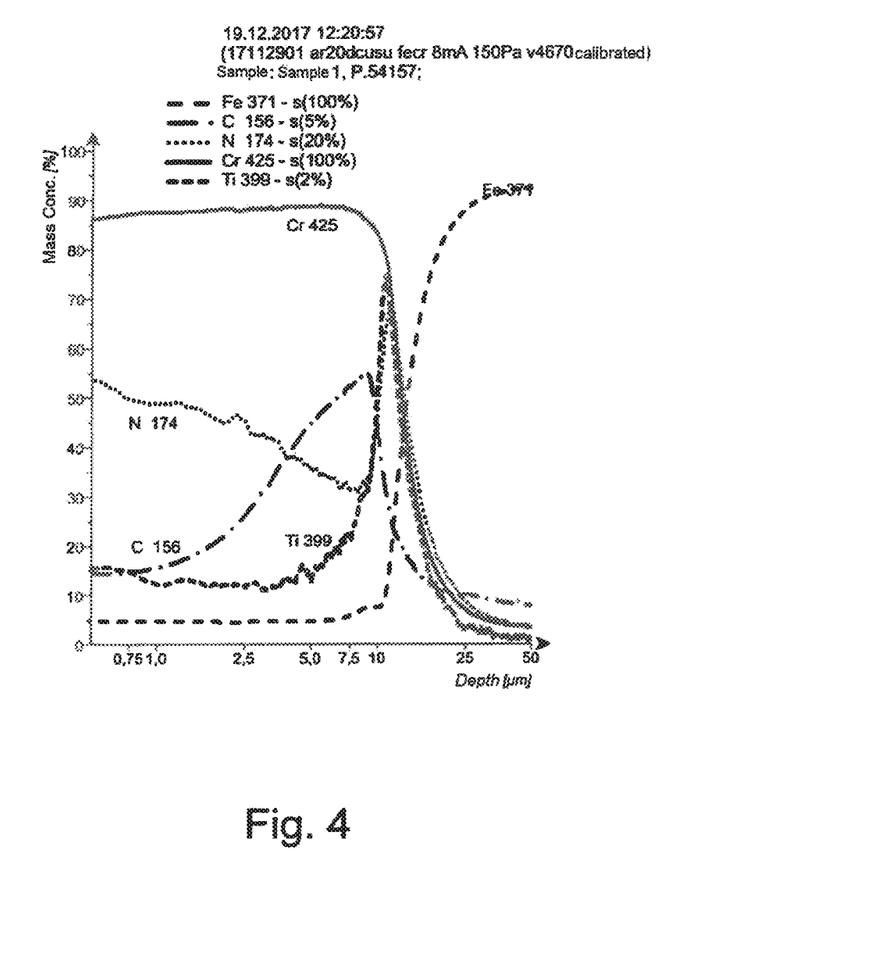

FIG. 4 shows the concentration profile of sample 2, in which an intermediate layer comprising primarily CrC has been integrated into the hard material layer. During the separation process, there was first heating from 0° C. to 950° C. for approx. 45 minutes. The holding time lasted 7 hours, and then there was a slow cool-down (approx. 10 hours) to 200° C. During the process, the reactor was flushed with nitrogen. As in FIG. 3, the horizontal axis specifies the depth, also in a logarithmic scale. The vertical axis shows the mass concentration in a relative scale. 100% on the vertical axis equates to a mass concentration of the elements Fe and Cr of 100%, of N 20%, and of C 5%.

The Fe mass concentration is constantly near 0% within the area from 0 to 3 μm. From 3 μm, the Fe mass concentration increases to 5%. In the area deeper than 8 μm, the Fe mass concentration increases sharply to 88%, up to 27 μm. From a depth greater than 27 μm, the Fe mass concentration increases constantly with a low gradient to 90%, at 50 μm. Accordingly, neither the hard material layer nor the Intermediate layer contains significant proportions of Fe carbide or Fe nitride.

The Cr mass concentration is at 81% at a depth of 0 μm, which then drops gently to a value of 78% at a depth of 2 μm. From a depth of 2 μm, the Cr mass concentration increases to the maximum value of 85% at a depth of 3 μm. From a depth of 3 μm, the Cr mass concentration drops to a value of 75% at a depth of 8 μm. Indeed, the fluctuations in this area of the hard material layer are within the measurement tolerance, meaning a nearly constant Cr mass concentration can be assumed. From a depth of 8 μm, the Cr mass concentration drops sharply down to 25 μm to a value of 5%. The hard material layer therefore has a layer thickness of at least 8 μm.

The N mass concentration has a value of 9.8% at 0 μm; at a depth of 2 μm, the N mass concentration is at an almost identical value with 9.4%. From a depth of 2 μm, the N mass concentration drops to a value of 4.4% at a depth of 4 μm. The N mass concentration then increases sharply to the maximum value of 17.6% at a depth of 8 μm. At a depth of 12 μm, the N mass concentration drops sharply to a value of 2% at 25 μm. Accordingly, the nitride content is almost constant down to a depth of approx. 2 μm, and then falls down to a depth of approx. 4 μm to around half the nitride content at the surface. From there, the nitride content increases to its maximum value in the hard material layer at a depth of approx. 8 μm and from there falls to a value of almost 0 at a depth of 25 μm. Accordingly, the thickness of the layer is approx. 12 μm.

At 0 μm, the C mass concentration has a value of 2.5% and increases to a value of 2.6% at 2 μm. From a depth of 2 μm, the C mass concentration increases sharply to a maximum value of 3.75% at 4 μm. From a depth of 4 μm, the C mass concentration falls sharply to a value of 0.35% at 15 μm. Accordingly, the carbide content is almost constant down to a depth of approx. 2 μm, and then falls down to a depth of approx. 4 μm to around double the carbide content at the surface. From there, the carbide content drops to a value of almost 0 at a depth of 15 μm.

The N mass concentration falls from 9.8% at the surface of the hard material layer 6 to 4.4% at a depth of 4 μm. Within the same area, the C mass concentration changes from 2.5% at the surface of the hard material layer 6 to its maximum value of 3.75% at 4 μm. At a depth of 4 μm of the hard material layer 6, the N mass concentration is at a relative minimum, the C mass concentration is at its maximum, while at the same time the Cr mass concentration is at 85% at this depth of 4 μm. Therefore, there are metal nitrides and carbides at this depth, here CrN and CrC, as an Intermediate layer 7 with roughly the same mass concentration.

Within a depth area of 4 to 8 μm, the N mass concentration and C mass concentration, and the nitride content and the carbide content, are inversely proportional; the mass concentration of CrN therefore rises again at greater depths in the hard material layer 6.

An analysis of the distributions of the mass concentrations of carbon and nitrogen shows that the mass concentration of the nitrogen is greater at the surface of the hard material layer than the mass concentration of the carbon. The ratio of the mass concentration of the metal nitrides to the mass concentration of the metal carbides is approximately 4:1.

What is claimed is:

1. A chain component of a chain for transmitting a force, said chain component comprising:
   a steel-based substrate;
   hard material layer disposed on an external side of the steel-based substrate and comprising metal nitrides; and
   metal carbides in the hard material layer at a content which decreases toward the external side of the hard material layer, wherein an average metal nitride content in the hard material layer is greater than an average metal carbide content in the hard material layer.

2. The chain component of claim 1, wherein the metal carbide content in the hard material layer increases in an area near to the substrate toward an inner side of the hard material layer.

3. The chain component of claim 2, wherein the amount of the increase of the metal carbide content in the hard material layer in an area near to the substrate is greater than the amount of the increase in an area of the decreasing metal carbide content.

4. The chain component of claim 1, wherein the metal carbide content in the hard material layer has a local maximum in the hard material layer.

5. The chain component of claim 4, wherein a span of the maximum amount of the metal carbide content in the hard material layer toward the external side of the hard material layer is smaller than a span of the maximum amount of the metal carbide content in the hard material layer toward a boundary between the hard material layer and the substrate.

6. The chain component of claim 1, wherein a metal nitride content in the hard material layer increases toward the external side of the hard material layer.

7. The chain component of claim 6, wherein the increase of the metal nitride content in the hard material layer in an area near to the substrate is greater than the increase in an area near to the external side of the hard material layer.

8. The chain component of claim 1, wherein the average metal nitride content in the hard material layer is greater than the average metal carbide content in the hard material layer by a factor of 2.

9. The chain component of claim 1, wherein an average metal carbide content in each layer section in the area near the surface of the hard material layer is less than 20 wt. %, wherein the area near the surface has a thickness of 80% of a total thickness of the hard material layer.

10. The chain component of claim 1, wherein an average Cr mass concentration in the hard material layer is greater than an average Fe mass concentration in the hard material layer.

11. The chain component of claim 10, wherein the average Cr mass concentration in the hard material layer is greater than the average Fe mass concentration in the hard material layer by a factor of 2.

12. The chain component of claim 1, wherein an average metal nitride content in the area near the surface of the hard material layer is greater than an average metal carbide content at every point in the hard material layer.

13. The chain component of claim 12, wherein the area near the surface of the hard material layer has a thickness of 50% of a total thickness of the hard material layer.

14. The chain component of claim 1, wherein an average Cr mass concentration in the area near the surface of the hard material layer is greater than an average Fe mass concentration at every point in the hard material layer.

15. The chain component of claim 14, wherein the area near the surface of the hard material layer has a thickness of 50% of a total thickness of the hard material layer.

16. The chain component of claim 1, wherein a mass concentration of metal nitrides at the surface of the hard material layer is greater than the mass concentration of the metal carbides on the external side of the hard material layer.

\* \* \* \* \*